United States Patent
Ishii

(10) Patent No.: US 10,876,204 B2
(45) Date of Patent: Dec. 29, 2020

(54) SUBSTRATE PROCESSING APPARATUS, EXHAUST PIPE COATING METHOD AND SUBSTRATE PROCESSING METHOD

(71) Applicant: TOKYO ELECTRON LIMITED, Tokyo (JP)

(72) Inventor: Katsutoshi Ishii, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/962,252

(22) Filed: Apr. 25, 2018

(65) Prior Publication Data

US 2018/0312969 A1 Nov. 1, 2018

(30) Foreign Application Priority Data

Apr. 27, 2017 (JP) .................................. 2017-088691

(51) Int. Cl.
| | |
|---|---|
| H01L 21/02 | (2006.01) |
| C23C 16/44 | (2006.01) |
| C23C 16/455 | (2006.01) |
| C23C 16/40 | (2006.01) |

(52) U.S. Cl.
CPC ........ *C23C 16/4412* (2013.01); *C23C 16/402* (2013.01); *C23C 16/4401* (2013.01); *C23C 16/45544* (2013.01); *H01L 21/0228* (2013.01); *H01L 21/02123* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,484,484 A | * | 1/1996 | Yamaga | C23C 16/345 118/719 |
| 2013/0252434 A1 | * | 9/2013 | Yuasa | H01L 21/02104 438/758 |
| 2014/0097267 A1 | * | 4/2014 | Shitara | B05B 15/555 239/106 |
| 2014/0287594 A1 | * | 9/2014 | Terasaki | C23C 16/45561 438/770 |
| 2015/0176125 A1 | * | 6/2015 | Nozawa | C23C 16/511 118/715 |

FOREIGN PATENT DOCUMENTS

| | | |
|---|---|---|
| JP | 05-086476 A | 4/1993 |
| JP | 3408530 B2 | 3/2003 |
| JP | 2005-064305 A | 3/2005 |
| JP | 2014-236129 A | 12/2014 |
| JP | 2015-012198 A | 1/2015 |
| JP | 2016-216817 A | 12/2016 |
| JP | WO2015045137 A1 | 3/2017 |

* cited by examiner

*Primary Examiner* — Moin M Rahman
(74) *Attorney, Agent, or Firm* — Nath, Goldberg & Meyer; Jerald L. Meyer

(57) ABSTRACT

A substrate processing apparatus includes a processing container configured to accommodate and process a substrate, an exhaust pipe connected to the processing container, an evacuation part configured to evacuate an interior of the processing container via the exhaust pipe, an exhaust pipe coating gas nozzle provided in the vicinity of the exhaust pipe inside the processing container and configured to supply at least one of a silicon-containing gas and an oxidizing gas into the exhaust pipe via the processing container, and a heating part configured to heat the processing container.

8 Claims, 3 Drawing Sheets

SUBSTRATE PROCESSING APPARATUS, EXHAUST PIPE COATING METHOD AND SUBSTRATE PROCESSING METHOD

CROSS-REFERENCE TO RELATED APPLICATION

This application is based upon and claims the benefit of priority from Japanese Patent Application No. 2017-088691, filed on Apr. 27, 2017, the entire contents of which are incorporated herein by reference.

TECHNICAL FIELD

The present disclosure relates to a substrate processing apparatus, an exhaust pipe coating method and a substrate processing method.

BACKGROUND

A member has been used for a semiconductor manufacturing apparatus which is formed by coating, on a surface of a steel base material, a composite oxide film made of a sintering aid which is a material that generates an amorphous inorganic substance by sintering. The sintering aid is at least one kind selected from silicon oxide-aluminum oxide-chromium oxide, boron salt compound and phosphate compound.

Such a composite oxide film is also applied to an exhaust pipe of a semiconductor manufacturing apparatus and is also used for coating the inside of an exhaust pipe made of stainless steel.

However, when a composite oxide film is formed inside the exhaust pipe, the coating of the composite oxide film is gradually etched when dry-cleaning the inside of the processing container of the semiconductor manufacturing apparatus. This poses a problem since the peelings of the coating become particles, which may adversely affect substrate processing.

In addition, when the coating of the composite oxide film has become thin due to multiple dry cleaning operations, it is necessary to coat the composite oxide film again. In order to perform the coating, there is a need to ask a professional coating specialist to conduct the coating. This poses a problem since it takes time and expense for maintenance.

SUMMARY

Some embodiments of the present disclosure provide a substrate processing apparatus, an exhaust pipe coating method and a substrate processing method, which are capable of suppressing generation of particles in an exhaust pipe and facilitating maintenance.

According to one embodiment of the present disclosure, there is provided a substrate processing apparatus including a processing container configured to accommodate and process a substrate, an exhaust pipe connected to the processing container, an evacuation part configured to evacuate an interior of the processing container via the exhaust pipe, an exhaust pipe coating gas nozzle provided in the vicinity of the exhaust pipe inside the processing container and configured to supply at least one of a silicon-containing gas and an oxidizing gas into the exhaust pipe via the processing container, and a heating part configured to heat the processing container.

According to one embodiment of the present disclosure, there is provided an exhaust pipe coating method, including: evacuating an interior of a processing container through an exhaust pipe connected to the processing container; and forming a $SiO_2$ coating film inside the exhaust pipe by supplying an oxidizing gas from the vicinity of the exhaust pipe inside the processing container and supplying a silicon-containing gas from an arbitrary position inside the processing container.

According to one embodiment of the present disclosure, there is provided a substrate processing method, including: carrying out the above-described exhaust pipe coating method; loading a substrate into the processing container; and processing the substrate by supplying a processing gas to the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
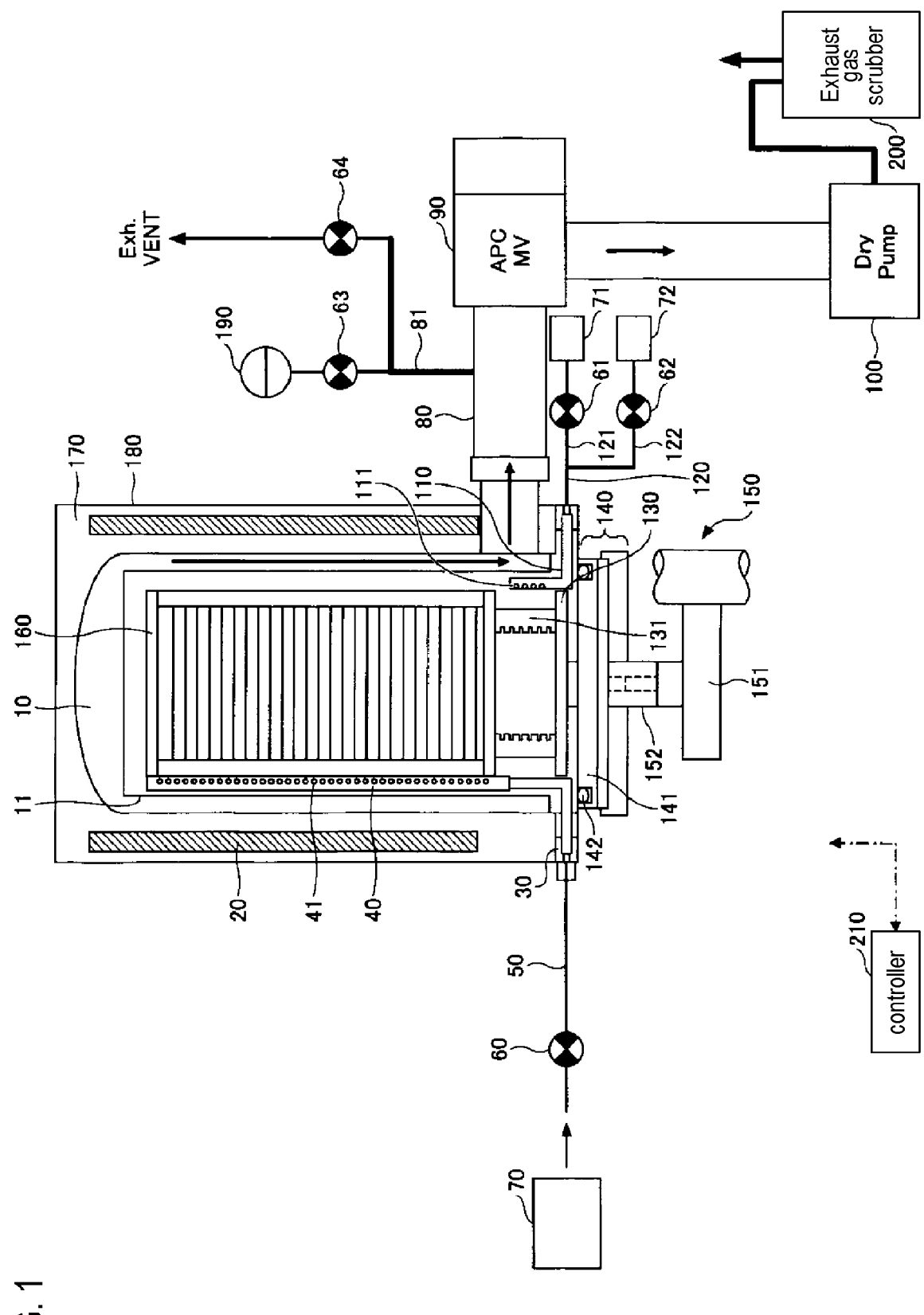
FIG. 1 is a view showing an example of a substrate processing apparatus according to an embodiment of the present disclosure.

FIG. 1 is a view showing an example of a substrate processing apparatus according to an embodiment of the present disclosure. As shown in FIG. 1, the substrate processing apparatus according to the present embodiment includes a reaction tube 10, an inner tube 11, a heater 20, a manifold 30, a processing gas nozzle 40, a processing gas supply pipe 50, valves 60 to 64, a processing gas supply source 70, a silicon-containing gas supply source 71, an oxidizing gas supply source 72, an exhaust pipe 80, an exhaust branch pipe 81, an automatic pressure control valve 90, a vacuum pump 100, an exhaust pipe coating gas nozzle 110, coating gas supply pipes 120 to 122, a table 130, a mounting stand 131, a lid 140, an elevating mechanism 150, a wafer boat 160, a heat insulating material 170, a housing 180, a pressure gauge 190, an exhaust gas scrubber 200, and a controller 210. The processing gas nozzle 40 has discharge holes 41, and the lid 140 has a flange portion 141. The elevating mechanism 150 includes an arm 151 and a rotating shaft 152. A plurality of wafers W is mounted on the wafer boat 160.

The substrate processing apparatus shown in FIG. 1 is configured as a vertical heat treatment apparatus that stacks a plurality of wafers W on the wafer boat 160 in a state of being spaced apart from each other at predetermined intervals in the vertical direction and performs a film forming process on the wafers by heating the wafers while supplying a processing gas from the processing gas nozzle 40 into the reaction tube 10, more precisely, the inner tube 11. The substrate processing apparatus according to the present embodiment can be applied to various substrate processing apparatuses as long as it is a substrate processing apparatus that performs substrate processing using a processing gas nozzle. In the present embodiment, description will be made on an example in which the substrate processing apparatus is configured as a vertical heat treatment apparatus.

The reaction tube 10 and the inner tube 11 are processing containers for accommodating the wafers W mounted on the wafer boat 160 and subjecting the wafers W to heat treatment. The reaction tube 10 and the inner tube 11 have a substantially cylindrical shape and have a height capable of batch-processing, all at once, several tens to hundreds of wafers W vertically stacked on the wafer boat 160. The reaction tube 10 and the inner tube 11 may be made of various materials, for example, quartz. Although not shown in FIG. 1, the ceiling of the inner tube 11 may be opened. A slit may be formed on the side surface of the inner tube 11 on the side of the exhaust pipe 80. The inside of the inner tube 11 can be evacuated by the vacuum pump 100.

The lower end, i.e., the bottom surface of the reaction tube 10 is opened, and the loading and unloading of the wafer boat 160 holding the wafers W is performed from a lower end opening.

The heater 20 is provided around the reaction tube 10 and is a heating means for heating the wafers W loaded into the inner tube 11 from the outside.

The manifold 30 is a part to which the processing gas supply pipe 50 for supplying a processing gas to the processing gas nozzle 40 provided inside the reaction tube 10 is connected. That is, the manifold 30 is configured so that the processing gas supply pipe 50 can be connected to the manifold 30 from the outside and the processing gas supply pipe 50 thus connected can communicate with the processing gas nozzle 40 provided inside the reaction tube 10. In addition, the manifold 30 has a shape protruding to the outer peripheral side similar to a flange.

The processing gas nozzle 40 is a gas supply means for supplying a processing gas to the inside of the reaction tube 10, more precisely the inner tube 11. The processing gas nozzle 40 is made of, for example, quartz. The processing gas nozzle 40 is inserted into the inner tube 11 from the manifold 30 and vertically extends along the inner circumferential surface of the inner tube 11. The processing gas nozzle 40 is configured so that a processing gas can be supplied to the wafers W from a plurality of discharge holes 41 that face inward. When the substrate processing apparatus performs a film forming process, a gas necessary for film formation is supplied. When the substrate processing apparatus performs other processes, a processing gas according to each application is supplied.

Although only one processing gas nozzle 40 is shown in FIG. 1 for the convenience of explanation, a plurality of processing gas nozzles 40 may be provided. In the case where the substrate processing performed by the substrate processing apparatus is a film forming process, it is often the case that plural types of processing gases reacting with each other to produce a reaction product are supplied. In the case of the processing gases for film formation, it is often the case that a raw material gas such as a silicon-containing gas, an organic metal-containing gas or the like and an oxidizing gas for oxidizing the raw material gas or a nitriding gas for nitriding the raw material gas are used in combination. As the oxidizing gas, for example, ozone, oxygen, water or the like is used. As the nitriding gas, ammonia is used in many cases. In addition, a processing gas nozzle 40 for supplying a purge gas used for purging the wafers W may be provided. As the purge gas, in addition to an inert gas represented by a nitrogen gas, a rare gas such as Ar, He or the like may also be used. In the case where a plurality of processing gas nozzles 40 is provided, the processing gas nozzles 40 may be arranged along the circumferential direction of the substantially cylindrical reaction tube 10.

The other end of the processing gas supply pipe 50 not connected to the reaction tube 10 is connected to the processing gas supply source 70 so that a processing gas can be supplied from the processing gas supply source 70 to the processing gas nozzle 40 via the processing gas supply pipe 50.

The valve 60 is provided in the processing gas supply pipe 50 and is configured so as to be able to control the supply and cutoff of the processing gas supplied to the processing gas nozzle 40 and adjust the flow rate of the processing gas at the time of supplying the processing gas.

The processing gas supply source 70 is a gas storage source for supplying a processing gas to the processing gas nozzle 40. The processing gas supply source 70 may supply various processing gases to the processing gas nozzle 40 depending on the application. For example, the processing gas supply source 70 may supply a raw material gas used in the case of performing a film forming process to the processing gas nozzle 40.

The exhaust pipe 80 is a conduit for evacuating the interior of the reaction tube 10. The exhaust pipe 80 is connected to an evacuation means such as a vacuum pump 100 or the like so that the interior of the reaction tube 10 can be evacuated. The automatic pressure control valve 90 for automatically regulating a pressure is provided in the middle route of the exhaust pipe 80.

The exhaust pipe 80 may be made of various materials, for example, stainless steel. Generally, coating of metal such as chromium or nickel is often applied to the inside of the exhaust pipe 80. However, in the substrate processing apparatus according to the present embodiment, such metal coating is not applied to the inside of the exhaust pipe 80. Instead, before performing substrate processing, a $SiO_2$ coating film is formed and glass coating is performed. The details of this point will be described later.

The vacuum pump 100 is an evacuation means for evacuating the interior of the reaction tube 10. For example, a dry pump is used as the vacuum pump 100. The vacuum pump 100 is not limited to the dry pump as long as it can evacuate the inside of the reaction tube 10. Various evacuation means may be used as the vacuum pump 100.

The branch exhaust pipe 81 is a pipe used for measuring the pressure in the exhaust pipe 80 or for lowering the pressure in the excessively pressurized exhaust pipe 80 in the case where the automatic pressure control valve 90 is closed in order to bring the pressure in the reaction tube 10 to an atmospheric pressure. When measuring the pressure in the exhaust pipe 80, the valve 63 is opened and the pressure is measured by the pressure gauge 190. On the other hand, when lowering the lid 140, the pressure in the reaction tube 10 is brought to an atmospheric pressure. In the case where the internal pressure of the reaction tube 10 becomes higher than the atmospheric pressure during lowering the lid, the valve 64 may be opened to lower the internal pressure of the reaction tube 10.

The exhaust pipe coating gas nozzle 110 is a gas nozzle for glass-coating the interior of the exhaust pipe 80 and supplying at least one of an oxidizing gas and a silicon-containing gas to form a $SiO_2$ coating film inside the exhaust pipe 80. By forming the $SiO_2$ coating film inside the exhaust pipe 80, the particles in the exhaust pipe 80 can be covered with the $SiO_2$ coating film from above and can be fixed by the $SiO_2$ coating film. This makes it possible to prevent the particles in the exhaust pipe 80 from being scattered in the reaction tube 10 during substrate processing.

The exhaust pipe coating gas nozzle 110 has discharge holes 111 for discharging at least one of an oxidizing gas and a silicon-containing gas. In FIG. 1, there is shown an example in which a plurality of discharge holes 111 is provided to face the center of the reaction tube 10. However, the discharge holes 111 may be provided so as to be oriented in different directions. For example, the discharge holes 111 may be provided in the direction extending along the inner circumferential surface of the inner tube 11 or in the direction facing the inner circumferential surface of the inner tube 11. Since the gas supply target is not the inside of the reaction tube 10 but the exhaust pipe 80, the discharge holes 111 may be provided by selecting a direction in which the gas is smoothly supplied to the exhaust pipe 80. Furthermore, the discharge holes 111 may be provided at the upper end of the exhaust pipe coating gas nozzle 110 instead of being provided on the side surface of the exhaust pipe coating gas nozzle 110. For example, one large discharge hole 111 may be provided at the upper end of the exhaust pipe coating gas nozzle 110 shown in FIG. 1. Since the distance to the exhaust pipe 80 is close, it is considered that the gas supply to the exhaust pipe 80 becomes smooth.

The coating gas supply pipes 120 to 122 are pipes for supplying a silicon-containing gas and an oxidizing gas, which are coating gases, to the coating gas nozzle 110. The coating gas supply pipe 121 is a silicon-containing gas supply pipe connected to the silicon-containing gas supply source 71. The valve 61 is provided in the coating gas supply pipe 121.

On the other hand, the coating gas supply pipe 122 is an oxidizing gas supply pipe connected to the oxidizing gas supply source 72. The valve 62 is provided in the coating gas supply pipe 122.

The coating gas supply pipe 120 is a confluent pipe of the coating gas supply pipe 121 and the coating gas supply pipe 122. When performing film formation by ALD (Atomic Layer Deposition), the silicon-containing gas and the oxidizing gas are alternately supplied. Therefore, either the silicon-containing gas or the oxidizing gas is always supplied from the coating gas supply pipe 120.

Specifically, if the valves 61 and 62 are switched so as to alternately perform an operation of supplying the silicon-containing gas from the silicon-containing gas supply source 71 with the valve 61 kept open and an operation of supplying the oxidizing gas from the oxidizing gas supply source 72 with the valve 62 kept open, the silicon-containing gas and the oxidizing gas are alternately supplied into the inner tube 11 from the exhaust pipe coating gas nozzle 110. Since the exhaust pipe coating gas nozzle 110 is disposed in the vicinity of the exhaust pipe 80 inside the inner tube 11, the silicon-containing gas and the oxidizing gas supplied from the exhaust pipe coating gas nozzle 110 are easily exhausted from the exhaust pipe 80 by the vacuum pump 100. That is, the silicon-containing gas and the oxidizing gas, which are gases for forming a $SiO_2$ film, are alternately supplied into the exhaust pipe 80. The silicon-containing gas is adsorbed inside the exhaust pipe 80. Then, the oxidizing gas is supplied so as to react on the inner surface of the exhaust pipe 80, whereby a $SiO_2$ film as a reaction product is formed. That is, glass coating is performed by ALD (Atomic Layer Deposition) film formation. The exhaust pipe coating gas nozzle 110 is provided in order to generate such a reaction inside the exhaust pipe 80.

In the case where one of the silicon-containing gas and the oxidizing gas can be supplied from the processing gas nozzle 40, only the other gas may be supplied from the exhaust pipe coating gas nozzle 110.

In the case where both the processing gas nozzle 40 capable of supplying the silicon-containing gas and the processing gas nozzle 40 capable of supplying the oxidizing gas are present in a plurality of processing gas nozzles 40, only the oxidizing gas may be supplied from the exhaust pipe coating gas nozzle 110. Since the oxidizing g gas is easier to handle than the silicon-containing gas, it is preferable that the nozzle for supplying the oxidizing gas is preferentially disposed in the vicinity of the exhaust pipe 80. In this case, it suffices to provide only the coating gas supply pipes 120 and 122, the valve 62 and the oxidizing gas supply source 72.

The film formation inside the exhaust pipe 80 may also be performed by CVD (Chemical Vapor Deposition) film formation which simultaneously supplies the silicon-containing gas and the oxidizing gas, in addition to the ALD film formation. Therefore, a configuration capable of simultaneously supplying the silicon-containing gas and the oxidizing gas may be adopted by providing two exhaust pipe coating gas nozzles 110 or by combining the exhaust pipe coating gas nozzle 110 with the processing gas nozzle 40, so that a $SiO_2$ coating film can be formed by CVD film formation. However, it is preferable to adopt the ALD film formation in view of the fact that, as compared with the CVD film formation, the ALD film formation is capable of performing film formation in a low temperature process, performing film formation with a small thickness and a high density, and performing film formation with excellent in-plane uniformity.

The table 130 is a support table for supporting the mounting stand 131 on which the wafer boat 160 is mounted.

The mounting stand 131 is as support stand provided on the table 130 and is configured to mount and support the wafer boat 160 together with the table 130. The table 130 and the mounting stand 131 may also be made of, for example, quartz.

The lid 140 is a lid member capable of hermetically closing the lower end opening of the reaction tube 10. A flange portion 141 having a sealing material 142 on its upper surface is provided in the upper portion of the lid 140 and is configured to seal the opening of the reaction tube 10. The flange portion 141 may be made of, for example, quartz. Although not shown in FIG. 1, the sealing material 142 is in contact with a part of the bottom surface on the outer peripheral side of the reaction tube 10 so that the lid 140 can be closed in a sealed state.

The elevating mechanism 150 is a mechanism for raising and lowering the lid 140, and has an arm 151 and a rotating shaft 152. The rotating shaft 152 is attached to the tip of the arm 151 supported by the elevating mechanism 150. The rotating shaft 152 passes through the lid 140. The table 130 is fixed to the tip of the rotating shaft 152. As a result, substrate processing may be performed while fixing the lid 140 against rotation and rotating the wafer boat 160 by the rotating shaft 152. The elevating mechanism 150 is capable of raising and lowering the wafer boat 160, the lid 140 and the like as a unit, and is configured so that only the table 130, the mounting stand 131 and the wafer boat 160 can be rotated. The table 130 may be fixedly provided on the side of the lid 140 so that the wafers W can be processed without rotating the wafer boat 160.

Accordingly, the lid 140 is configured to be able to ascend and descend while supporting the wafer boat 160 on which the wafers W are mounted, and is configured to be able to hermetically seal the lower end opening of the reaction tube 10 while supporting the wafer boat 160. Therefore, the loading of the wafer boat 160 into the reaction tube 10 and the unloading of the wafer boat 160 from the reaction tube 10 are carried out by raising and lowering the lid 140 in a state in which the wafer boat 160 is supported above the lid 140.

As described above, the wafer boat 160 is a substrate holder capable of horizontally holding a plurality of wafers W at predetermined intervals in the vertical direction. The wafer boat 160 may also be made of, for example, quartz.

The heat insulating material 170 is a means for preventing the heat of the heater 20 from leaking to the outside. The heat insulating material 170 is provided so as to cover the reaction tube 10 and the heater 20.

The housing 180 is a housing means for covering the entire vertical heat treatment apparatus. The inside of the housing 180 is filled with the heat insulating material 170 to suppress the release of heat to the outside.

The exhaust gas scrubber 200 is provided on the downstream side of the vacuum pump 100 and is a device that performs a process of converting harmful substances into harmless substances.

The controller 210 is a means for controlling the entire vertical heat treatment apparatus. The controller 210 also controls the switching of the opening and closing of the valves 60 to 64 and the operation of the vacuum pump 100. The controller 210 may be configured by various arithmetic processing means. For example, the controller 210 may be configured by a microcomputer including a CPU (Central Processing Unit) and a memory such as a ROM (Read Only Memory), a RAM (Random Access Memory) or the like and operated by a program, or may be configured by an ASIC (Application Specific Integrated Circuit) or the like which is an integrated circuit in which a plurality of functional circuits is combined into one for s specific use. The controller 210 has an arithmetic processing function and may be configured by various means as long as it can control the entire heat treatment apparatus.

The controller 210 also controls the supply timing of the processing gas, the silicon-containing gas and the oxidizing gas supplied from the processing gas nozzle 40 and the exhaust pipe coating gas nozzle 110. This makes it possible to perform ALD film formation.

In addition to the configuration shown in FIG. 1, the vertical heat treatment apparatus includes a wafer transfer mechanism for transferring a wafer W from a wafer cassette such as a FOUP (Front Opener Unified Pod) or the like to the wafer boat 160, and the like. Since the relevance of these elements to the characteristic parts of the substrate processing apparatus according to the present embodiment is small, the illustration and description thereof will be omitted in the present embodiment.

Next, the principle of an exhaust pipe coating method and a substrate processing method according to an embodiment of the present disclosure will be described.

FIGS. 2A to 2F are views for explaining the principle of an exhaust pipe coating method and a substrate processing method according to an embodiment of the present disclosure.

Figure 2:
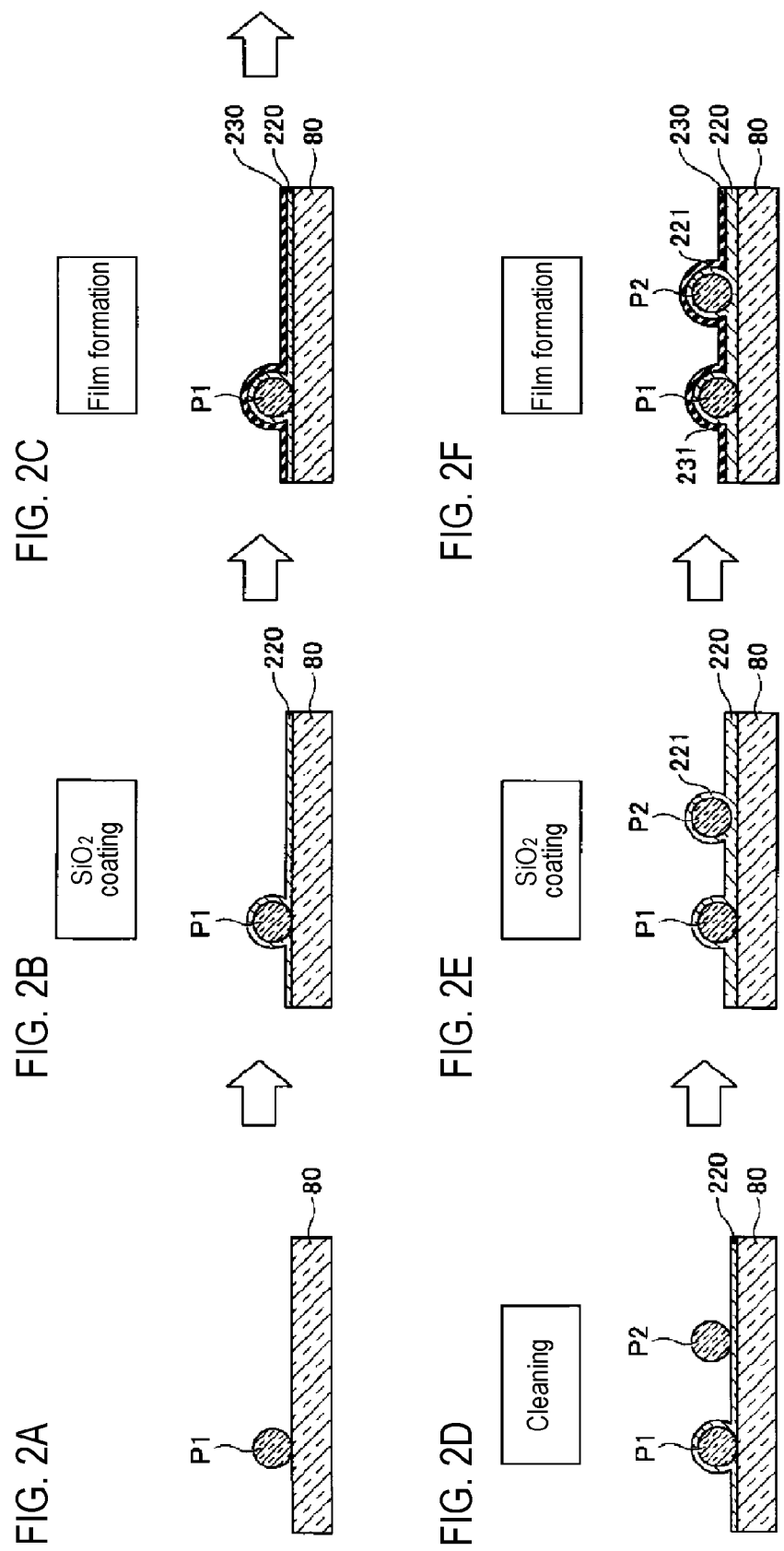
FIGS. 2A to 2F are views for explaining the principle of an exhaust pipe coating method and a substrate processing method according to an embodiment of the present disclosure.

FIG. 2A is a view showing the state of the inner wall of the exhaust pipe 80 to which particles P1 adhere. There is no particular limitation on the type and property of the particles P1.

FIG. 2B is a view showing a state in which the exhaust pipe coating method according to the present embodiment is performed. A $SiO_2$ coating film 220 is formed so as to cover the entire inner wall of the exhaust pipe 80 including the top of the particles P1. Since $SiO_2$ is a component of glass, glass coating is applied to the inside of the exhaust pipe 80. By the formation of the $SiO_2$ coating film 220, the particles P1 are fixed. This makes it possible to prevent the particles P1 from flowing backward from the exhaust pipe 80 and being scattered on the wafers W.

The coating of the inside of the exhaust pipe 80 is performed when the wafers W are not present inside the reaction tube 10. That is, the coating is performed before a film forming process or after dry cleaning.

FIG. 2C is a view showing a state in which a film forming process is performed. In the film forming process, the processing gas used for the film forming process may well flow into the exhaust pipe 80 through which the inside of the reaction tube 10 is evacuated. Even inside the exhaust pipe 80, the same reaction as the film forming process occurs. Thus, a film 230 for film formation is deposited on the $SiO_2$ coating film 220 to some extent. The particles P1 are fixed in the exhaust pipe 80 even at the time of the film forming process and can be prevented from being scattered onto the wafers W. The film 230 formed by the film forming process may be any type. The film 230 may be a silicon oxide film just like the $SiO_2$ coating film 220 or a high-k film containing an organometallic element. Further, the film 230 is not limited to the oxide film but may be a nitride film. As described above, the exhaust pipe coating method according to the present embodiment may be applied to various processes. Although it is the film forming process that the particles P1 originated from quartz are likely to be generated, the exhaust pipe coating method is effective for all types of particles P1 and thus, is applicable not only to the film forming process but also to other substrate processing processes.

FIG. 2D is a view showing a state in which dry cleaning is performed. After the film forming process, the formed film 230 may be removed by performing dry cleaning as necessary. The dry cleaning may be performed for each film formation or may be performed when the accumulated film thickness of the film 230 reaches a predetermined thickness (μm). At this time, the accumulated film thickness may not be measured inside the exhaust pipe 80. It suffices to perform the measurement at any point inside the inner tube 11.

Since the dry cleaning is aimed at removing the film 230 used in the film forming process, the $SiO_2$ coating film 220 remains without being removed.

There is a possibility that new particles P2 are generated after the dry cleaning. The new particles P2 are placed on the $SiO_2$ coating film 220.

FIG. 2E is a view showing a state in which the exhaust pipe coating method is performed for the second time. As a result, the $SiO_2$ coating film 221 is also formed on the new particles P2, whereby the particles P1 and P2 are fixed on the inner wall of the exhaust pipe 80.

FIG. 2F is a view showing a state in which the film forming process is performed for the second time. Although a film 231 is formed on the SiO$_2$ coating film 221, the particles P1 and P2 remain fixed inside the exhaust pipe 80 and do not adversely affect the film forming process.

As described above, according to the exhaust pipe coating method and the substrate processing method according to the present embodiment, it is possible to fix the particles P1 and P2 in the exhaust pipe 80. This makes it possible to prevent the particles P1 and P2 from being scattered onto the wafers W.

In addition, the metal coating in the exhaust pipe 80, which has been conventionally necessary, becomes unnecessary. There is no need to request an external specialist to form such a metal coating film. It is possible for a worker, who performs a film forming process, to carry out glass coating without removing the exhaust pipe 80. Thus, it is possible to considerably save both time and cost, and to increase the operation rate.

Figure 3:
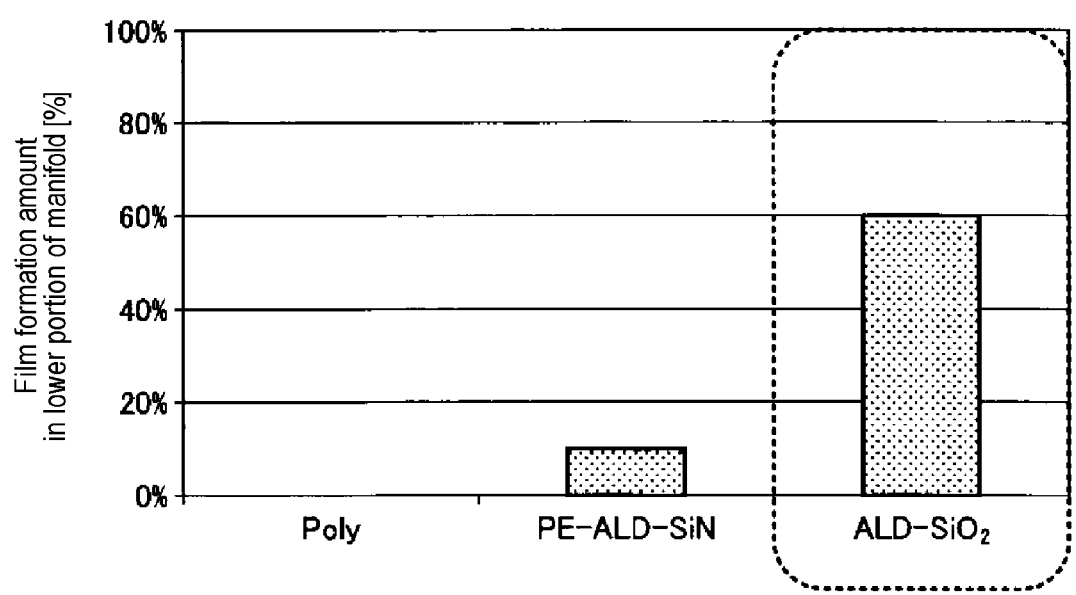
FIG. 3 is a view showing a film formation amount on a lower portion of the inside of a manifold for each type of silicon-containing film.

FIG. 3 is a view showing a film formation amount in the lower portion of the manifold for each type of silicon-containing film. The temperature of the lower portion of the manifold 15 at the time of film formation is lower than the temperature of the region where the film formation is performed, making it difficult to form a film on the lower portion of the manifold 15. However, as shown in FIG. 3, even in the lower portion of the manifold 15 having a relatively low temperature and existing outside the film formation region, the film formation amount of the SiO$_2$ film is remarkably larger than that of another type of silicon-containing film (a polysilicon film or a SiN film). In the exhaust pipe coating method according to the present embodiment, by using the properties of the SiO$_2$ film capable of being formed even at such a low temperature, the SiO$_2$ coating film is formed inside the exhaust pipe 80 at a low temperature without increasing the temperature inside the reaction tube 10 as in the film formation.

Next, referring again to FIG. 1, the operation for carrying out the exhaust pipe coating method and the substrate processing method according to the present embodiment will be described.

The exhaust pipe coating method according to the present embodiment is performed before the film forming process, after the dry cleaning, and the like. Accordingly, the exhaust pipe coating method is performed in a state in which the wafer boat 160 is not loaded into the reaction tube 10 and in a state in which the lid 140 is closed. Therefore, although the wafer boat 160 is shown in FIG. 1, the exhaust pipe coating method may be carried out in a state in which the wafer boat 160 is not present.

In the exhaust pipe coating method according to the present embodiment, first, the vacuum pump 100 is operated to evacuate the inside of the reaction tube 10. At this time, the automatic pressure control valve 90 may well be opened. Furthermore, in order to form a film inside of the exhaust pipe 80, the heater 20 is also heated to a temperature at which film formation is possible.

Next, both or at least one of a silicon-containing gas and an oxidizing gas are supplied from the exhaust pipe coating gas nozzle 110. Various gases containing a silicon element may be used as the silicon-containing gas. For example, a silane gas such as an aminosilane gas, a monosilane gas, a disilane gas or the like may be used. In addition, as the gas to become an oxidizing species, it may be possible to select a gas conforming to the use, such as an ozone gas, an oxygen gas, water or the like.

When a processing gas nozzle 40 for supplying the silicon-containing gas is present in the processing gas nozzles 40, the silicon-containing gas may be supplied from the processing gas nozzle 40 and only the oxidizing gas may be supplied from the exhaust pipe coating gas nozzle 110. As for the supply method, the silicon-containing gas and the oxidizing gas are simultaneous supplied in the case of CVD film formation, but the silicon-containing gas and the oxidizing gas are alternately supplied in the case of ALD film formation. The silicon-containing gas and the oxidizing gas supplied into the reaction tube 10 (more precisely, the inner tube 11) are sucked into the exhaust pipe 80 by the evacuation of the vacuum pump 100, and a SiO$_2$ coating film 220 is formed on the inner wall of the exhaust pipe 80.

On the other hand, when only the nozzle for supplying the oxidizing gas is present in the processing gas nozzles 40, the oxidizing gas may be supplied from the processing gas nozzle 40 and the silicon-containing gas may be supplied from the exhaust pipe coating gas nozzle 110. Even in this case, a SiO$_2$ coating film 220 can be formed on the inner wall of the exhaust pipe 80.

In the case where neither the nozzle for supplying the silicon-containing gas nor the nozzle for supplying the oxidizing gas is included in a plurality of processing gas nozzles 40, both the silicon-containing gas and the oxidizing gas may be supplied from the exhaust pipe coating gas nozzle 110. In the ALD film formation, different kinds of gases are alternately supplied. Therefore, if the silicon-containing gas and the oxidizing gas are alternately supplied from the single exhaust pipe coating gas nozzle 110, it is possible to form a SiO$_2$ coating film 220 on the inner wall of the exhaust pipe 80 using the ALD film formation method. Furthermore, a coating gas nozzle 110 for supplying a silicon-containing gas and a coating gas nozzle 110 for supplying an oxidizing gas may be provided separately to perform ALD film formation, or a silicon-containing gas and an oxidizing gas may be simultaneously supplied to perform CVD Film formation. However, ALD film formation is preferable as described above.

After forming the SiO$_2$ coating film 220 inside the exhaust pipe 80 in this manner, the automatic pressure control valve 90 is closed, the glass coating inside the exhaust pipe 80 is terminated, and the preparation for substrate processing is completed. Thus, the wafer boat 160 on which a plurality of wafers W are mounted is loaded into the reaction tube 10.

When the pressure inside the reaction tube 10 reaches a predetermined pressure, the valve 60 is opened, and the processing gas is supplied from the processing gas nozzle 40 to perform a film forming process. As described with reference to FIG. 2C, the particles P1 remain fixed on the inner wall of the exhaust pipe 80. It is therefore possible to prevent the particles P1 from adversely affecting the film formation on the wafers W.

In the film forming process, a purge gas supply nozzle may be appropriately installed inside the inner tube 11, and a step of appropriately supplying a purge gas into the inner tube 11 may be included. Particularly, in the case of performing ALD film formation, it is often the case that a purge gas is supplied when changing the type of the processing gas to be supplied. As the purge gas, in addition to a nitrogen gas, a rare gas such as Ar, He or the like may be used.

Upon completion of the film forming process, the lid 140 is lowered to unload the wafer boat 160. Thereafter, if necessary, dry cleaning may be performed by tightly closing the lid 140 in a state in which the wafer W does not exist.

The dry cleaning may be performed using a fluorine-based dry cleaning gas, for example, HF or the like. The dry cleaning may be performed by providing a dedicated gas nozzle inside the reaction tube 10 and supplying a cleaning gas such as HF or the like from the gas nozzle. At that time, the interior of the reaction tube 10 is evacuated through the exhaust pipe 80 by the vacuum pump 100. As a result, it is possible to remove the film 230 adhering to the inner wall of the exhaust pipe 80.

The dry cleaning may be performed either for each film formation or at the time when a predetermined film thickness is reached.

Thereafter, by repeating the coating and the film formation again, it is possible to perform a film formation process while suppressing particles.

The coating step is preferably performed for each film formation process. However, if necessary, the coating step may be performed once each time when the film forming process is performed several times. Such adjustment may be appropriately performed depending on the application.

In addition, the opening and closing of the valves 60 to 64 and the automatic pressure control valve 90 and the operation of the vacuum pump 100 may be controlled by the controller 210.

According to the substrate processing apparatus, the exhaust pipe coating method and the substrate processing method according to the present embodiment, the interior of the exhaust pipe 80 is coated with the $SiO_2$ coating film 220, which makes it possible to fix the particles P1 and P2 inside the exhaust pipe 80 and to perform high-quality substrate processing.

After the $SiO_2$ coating film 220 is removed by dry cleaning, the $SiO_2$ coating film 220 may be formed again in the same manner. Since there is no need to ask a specialist to form a coating film, it is possible to easily form a coating film in a short time and at low cost.

According to the present disclosure in some embodiments, it is possible to suppress generation of particles in an exhaust pipe.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a processing container configured to accommodate and process a substrate;
an exhaust pipe connected to the processing container;
a processing gas nozzle configured to supply a processing gas for processing the substrate into the processing container;
an evacuation part configured to evacuate an interior of the processing container via the exhaust pipe;
a first coating gas supply pipe configured to supply a first coating gas including a silicon-containing gas;
a second coating gas supply pipe configured to supply a second coating gas including an oxidizing gas;
a coating gas nozzle disposed in the vicinity of the exhaust pipe inside the processing container and configured to supply the first coating gas and the second coating gas, which are supplied from the first coating gas supply pipe and the second coating gas supply pipe, into the exhaust pipe; and
a heating part configured to heat the processing container,
wherein an inner surface of the exhaust pipe is coated with a $SiO_2$ coating film while heating the processing container by the heating part;
wherein the $SiO_2$ coating film is formed by adsorbing the first coating gas supplied from the coating gas nozzle inside the exhaust pipe and then supplying the second coating gas supplied from the coating gas nozzle to react on the inner surface of the exhaust pipe; and
wherein the $SiO_2$ coating film is formed when the substrate is not present inside the processing container.

2. The apparatus of claim 1, wherein the $SiO_2$ coating film is formed inside the exhaust pipe while evacuating the interior of the processing container by the evacuation part.

3. The apparatus of claim 2, wherein the $SiO_2$ coating film is formed by ALD film formation.

4. The apparatus of claim 1, wherein the $SiO_2$ coating film is formed by ALD film formation.

5. The apparatus of claim 1, further comprising:
a cleaning gas nozzle configured to supply a cleaning gas into the processing container,
wherein the time when the substrate is not accommodated in the processing container includes a time after a cleaning is performed inside the processing container by supplying the cleaning gas from the cleaning gas nozzle.

6. The apparatus of claim 1, wherein the processing container has a shape including a vertically elongated cylindrical side surface configured to accommodate a substrate holder capable of stacking a plurality of horizontally held substrates at predetermined intervals in a vertical direction and includes an inner tube having a cylindrical side surface extending along an inner circumferential surface of the vertically elongated cylindrical side surface, and the coating gas nozzle is provided inside the inner tube.

7. The apparatus of claim 1, wherein a plurality of processing gas nozzles configured to supply a processing gas is provided inside the processing container, and
when the substrate is accommodated in the processing container, a film forming process is performed on the substrate by the processing gas.

8. The apparatus of claim 1, wherein the silicon-containing gas is a silane gas, and
the oxidizing gas is an ozone gas.

* * * * *